United States Patent
Jiang et al.

(10) Patent No.: US 6,893,952 B2
(45) Date of Patent: *May 17, 2005

(54) METHODS OF FORMING A BALL GRID ARRAY INCLUDING A NON-CONDUCTIVE POLYMER CORE AND A SILVER OR SILVER ALLOY OUTER LAYER

(75) Inventors: Tongbi Jiang, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

This patent is subject to a terminal disclaimer.

(21) Appl. No.: 10/358,810

(22) Filed: Feb. 5, 2003

(65) Prior Publication Data

US 2003/0119299 A1 Jun. 26, 2003

Related U.S. Application Data

(63) Continuation of application No. 09/645,833, filed on Aug. 25, 2000, now Pat. No. 6,610,591.

(51) Int. Cl.$^7$ ............................................... H01L 21/44
(52) U.S. Cl. ........................ 438/611; 438/612; 438/613; 438/614
(58) Field of Search ................................ 438/108, 611, 438/612, 613, 614

(56) References Cited

U.S. PATENT DOCUMENTS

| | | | |
|---|---|---|---|
| 3,986,255 A | 10/1976 | Mandal | 29/848 |
| 5,431,328 A | 7/1995 | Chang et al. | 228/180.22 |
| 5,477,087 A | 12/1995 | Kawakita et al. | 257/737 |
| 5,506,756 A | 4/1996 | Haley | 361/789 |
| 5,861,324 A | 1/1999 | Ichinose et al. | 438/119 |
| 5,956,235 A | 9/1999 | Kresge et al. | 361/774 |
| 6,120,885 A | 9/2000 | Call et al. | 428/209 |
| 6,283,359 B1 | 9/2001 | Brofman et al. | 228/180.22 |
| 6,300,164 B1 | 10/2001 | Call et al. | 428/209 |
| 6,337,445 B1 | 1/2002 | Abbott et al. | 174/260 |
| 6,365,500 B1 | 4/2002 | Chang et al. | 438/614 |
| 6,472,594 B1 | 10/2002 | Ichinose et al. | 136/296 |

FOREIGN PATENT DOCUMENTS

| | | |
|---|---|---|
| EP | 0 689 240 A1 | 12/1995 |
| JP | 10-150262 | 6/1998 |

*Primary Examiner*—W. David Coleman
*Assistant Examiner*—William M. Brewster
(74) *Attorney, Agent, or Firm*—TraskBritt

(57) ABSTRACT

A ball grid array for a flip-chip assembly is disclosed. The ball grid array includes a plurality of bumps bonded between an active surface of a semiconductor die and a top surface of a printed circuit board or any type of substrate carrier. The plurality of balls include at least one bump having a core material and an outer layer. The rigidity of the core material is greater than that of the material of the outer layer. Additionally, the melting temperature of the core material is higher than the material of the outer layer. By this arrangement, the core material with an outer layer provides bumps that are substantially uniform in height. In addition, the balls only procure marks or deformation to the core material during burn-in testing and reflow. Therefore, when bonding the semiconductor device to the substrate, the ball grid array provides sufficient electrical and mechanical connection despite any non-planarity in the active surface of the semiconductor device and the top surface of the substrate, and any differing height in the plurality of balls due to testing the semiconductor device.

13 Claims, 4 Drawing Sheets

METHODS OF FORMING A BALL GRID ARRAY INCLUDING A NON-CONDUCTIVE POLYMER CORE AND A SILVER OR SILVER ALLOY OUTER LAYER

CROSS-REFERENCE TO RELATED APPLICATION

This application is a continuation of application Ser. No. 09/645,833, filed Aug. 25, 2000, now U.S. Pat. No. 6,610,591, issued Mar. 4, 2003.

BACKGROUND OF THE INVENTION

1. Field of the Invention

The present invention relates generally to a ball grid array. More specifically, the present invention relates to a ball grid array used in a flip-chip type on-board semiconductor assembly.

2. State of the Art

Advances in semiconductor technology have facilitated the development of smaller integrated circuits having higher operating speeds. Presently, industry possesses technology to fabricate computers, telephones, scanners and video cameras and other electronic devices that can fit within a shirt pocket or similar space, at decreasing manufacturing costs and sales prices. Much of these size reductions and higher operating speeds have been facilitated by design of smaller and smaller semiconductor devices having a larger number of electrical connections for each semiconductor device.

With the miniaturization and increased operating speeds of semiconductor devices, packaging techniques are also being revised. Of the packaging techniques, much effort is being placed to keep up with the size reductions and operating speed increases of semiconductor devices utilizing chip-on-board (COB) assembly techniques. Among the COB techniques for attaching semiconductor devices to a printed circuit board are wire bonding, tape automated bonding (TAB), and flip-chip attachment.

In wire bonding, numerous wires are connected to contact pads on the semiconductor device and extend outwardly over the edges of the semiconductor device to correspond with contact pads on a substrate or printed circuit board. The process requires individual connections of each contact on the semiconductor device and requires an area of the substrate substantially larger than the semiconductor device itself. Also, due to the long lengths of the wire used to connect the chip to the printed circuit board and the resistance thereof, the speed at which the semiconductor device interacts with other circuitry is affected and, generally, is slower with longer lengths of wire.

In tape automated bonding or TAB, metallic leads are disposed on a polymeric tape. The leads may be connected individually or in mass to the contact pads of the semiconductor device and to the contact pads of the substrate. Unfortunately, like the wire bonding method, this method also requires utilizing a substantial area of the surface of the substrate. Also, depending upon the length of the metallic leads on the tape connected to the semiconductor device, the speed at which the semiconductor device interacts with other circuitry is affected and, generally, is slower as the length of the metallic leads increases.

On the other hand, flip-chip attachment techniques utilize the least amount of space and offer shorter interconnections with other circuitry for potentially increased interaction response, that is, the space utilized on the substrate is substantially equal to the semiconductor device itself. In a flip-chip attachment technique, bond pads on the active surface of a semiconductor device may include an array of solder balls for mounting directly to a substrate, such as a printed circuit board, a carrier, and/or another semiconductor device. The array of solder balls on the semiconductor device is commonly referred to as a ball grid array (BGA). The BGA must be a mirror image of the connecting pads on the printed circuit board so that precise connection is made. With the solder balls arranged between the semiconductor device and substrate, electrical and mechanical connection is made thereto by reflowing the solder balls.

Of the three discussed COB techniques, a flip-chip type attachment technique is believed by some to be best suited to comply with the trend of miniaturization and increased operating speeds of semiconductor devices. However, in comparison to the interconnect bumps in a BGA utilized elsewhere in semiconductor packaging (i.e., approximately 0.8 mm–1.3 mm diameter), the prior art interconnect bumps utilized in flip-chip assemblies are of a minute size (i.e., approximately 0.3 mm–0.8 mm diameter). Because of the minute size necessary for flip-chip packaging, the choice of metallization for the flip-chip assembly interconnect bumps is solder material or variations thereof, wherein the conventional interconnect bumps employed are bumps made entirely of solder material.

Although flip-chip attachment techniques utilize less space and are more responsive than other COB techniques, there are several problems associated with flip-chip packaging and the solder balls employed therein. Among the problems include the planarity of the substrate and the semiconductor die, which planarity of both affect the solder bumps and solder balls therebetween in providing sufficient electrical and mechanical connection. Compounding this difficulty of planarity is the difficulty of providing solder balls with a consistent solder ball diameter yielding a ball height. As a result of the planarity and solder bump and solder ball height problems, the solder bumps and solder balls often become deformed and marked in test sockets during reflow and burn-in testing due to the softness of the solder material. Also, the solder bumps and solder balls may become deformed during handling of the semiconductor device. Further, the solder bumps or solder balls may be knocked off or removed from one or more of the bond pads of the semiconductor device during handling. Consequently, the solder balls are often too deformed, too marked, or missing, to provide sufficient electrical and mechanical connection in the final mounting of the semiconductor device to the substrate.

Furthermore, the solder material used for the solder bumps or solder balls may be selected for mechanical properties for attaching the semiconductor device to the substrate or printed circuit board, rather than being selected for having good electrical conductivity properties during service. As the operational speed of semiconductor devices is constantly increasing, it is more important that the material for the attachment of the semiconductor device to the substrate or printed circuit board be selected for electrical properties while having the ability to form mechanical connections having the desired characteristics.

Also, the use of solder balls and solder material on the bond pads of semiconductor devices and substrates requires the use of solder flux which can be difficult to apply and control in solder reflow operations to prevent damage to the semiconductor device and substrate. Therefore, it is desirable to minimize the use of solder and solder flux for the formation of the connections between the semiconductor device and the substrate or printed circuit board to which it is attached.

In U.S. Pat. No. 2,934,685 is illustrated a ball or sphere, having a diameter on the order of 0.005 inches, made from an inert material, such as tungsten or molybdenum, coated with a layer of gold-containing antimony, and attached to a semiconductor wafer. A layer of aluminum is subsequently applied thereto. With the heating of the ball or sphere, the aluminum penetrates the upper layer of the semiconductor body, thereby causing a portion of the upper layer to be converted to p-type conductivity.

In U.S. Pat. No. 3,496,428 is illustrated a metal contact comprising a preliminary metallizing layer of gold nickel on the surface of the p-type region of a semiconductor wafer substrate and a silver dot in the shape of a somewhat hemispherical ball alloyed to the metal layer. A nickel layer is subsequently deposited on the silver dot.

U.S. Pat. No. 5,841,198 illustrates a ball grid array package utilizing solder balls having central cores of a material with a higher melting point than the solder material surrounding the core. When the ball grid package and motherboard assembly are heated to the melting point of the solder material, the cores of the solder balls remain solid and function as spacers in preventing direct contact of the package surface and the motherboard surface. The core of the solder ball can comprise a lead tin alloy having a higher melting point than conventional solder, such as 90% lead and 10% tin by weight, which melts at approximately 290° C. or, alternately, may comprise copper. The solid core of the solder ball can be plated onto the solid core, or the solid core can be dipped in liquid solder with surface tension coating the core material.

U.S. Pat. No. 5,971,253 illustrates a microelectronic element assembly, such as a semiconductor chip assembly, using a connection component incorporating a dielectric sheet with electrically conductive elements therein. Each electrically conductive element may include a flexible body and a flexible conductive shell.

U.S. Pat. No. 5,736,790 illustrates a bump formed on a pad that is provided on either a semiconductor chip, a package, or a wiring substrate for input or output thereof. The bump includes a projection projecting from the pad, a ball having conductivity and located above the pad, and a conductive bonding material for bonding the pad and the ball, wherein the creep strength of the ball is larger than the strength of the conductive bonding material.

U.S. Pat. No. 5,808,853 illustrates a capacitor having a multilevel interconnection technology using at least one solder ball reflowed and secured onto the capacitor. The solder ball is in electrical communication with the capacitor through a contact. A cap of low melting-point metal is secured on the reflowed solder ball.

U.S. Pat. No. 5,989,937 illustrates a method for compensating for bottom warpage of a ball grid array (BGA) integrated circuit. The solder balls arrayed on the bottom surface of a package of the integrated circuit provide for surface mounting of the integrated circuit by solder reflow. The solder balls are planarized to compensate individually for warpage of the integrated circuit package by variations in the individual dimensions of dependency of each solder ball below the bottom surface of the package.

Illustrated in U.S. Pat. No. 5,400,950 is a method for controlling solder bump height for flip-chip integrated circuit devices. The method of controlling the height of the solder bumps involves the use of non-input/output or dummy solder bumps which are present in sufficient numbers to overcome the tendency for the input/output solder bumps to draw the flip-chip excessively close to the circuit board. Because the dummy solder bumps are electrically inactive, their height can be governed by electrically isolating pads on the surface of the circuit board.

U.S. Pat. No. 5,903,058 illustrates a method for forming under bump metallurgy pads and solder bump connections for a flip-chip. The method employs a sloped-wall via for the formation of the under bump metallurgy pads, since sloped edges or walls of a via assist in forming the spherical solder ball when the initially-deposited solder is heated.

U.S. Pat. No. 3,809,625 illustrates silver bumps electroplated on gold pads until the bump height reaches a range of 0.5 to 1.5 mils, resulting in a bump width of 7 to 8 mils. A gold plating is then applied to the silver bumps. The bumps may also be formed of solder containing ten percent (10%) by weight tin and ninety percent (90%) by weight lead.

In U.S. Pat. No. 4,600,600 are illustrated thin metallic layers used as an adhesion layer and a diffusion barrier between lead contacts formed of electro-deposited copper and the chip-internal interconnects of a semiconductor circuit or substrate.

U.S. Pat. No. 5,461,261 illustrates a semiconductor chip provided with bumps formed of alternating layers of gold and tin by electroplating or vacuum evaporation, the gold and tin layers being capable of eutectic reaction. The gold and tin layers are deposited on a layer of tungsten and titanium formed on a layer of aluminum. The formation of the bumps by the electroplating of gold and tin results in the bumps having a slight disparity in the bump height.

In U.S. Pat. No. 5,640,052 are illustrated the pads of a semiconductor chip and the pads of a substrate connected to each other by solder bumps having an hourglass shape, each solder bump including a metal core and solder reflowed thereover.

U.S. Pat. No. 5,506,756 illustrates a ball grid array (BGA) package that contains an integrated circuit die mounted on flexible polyimide tape material. The conductors on the flexible polyimide tape material and the bond pads on the second surface of the integrated circuit die have solder balls attached thereto for connection to a printed circuit board. The solder balls are preferably constructed from a relatively resilient material, such as a 60:40 lead-tin composition, 62:32:2 lead-tin-silver composition or an indium alloy to withstand the stresses created within the solder joints with the printed circuit board.

U.S. Pat. No. 5,334,857 illustrates a semiconductor device provided with solder balls that are electrically coupled to portions of a semiconductor die necessary for operation. The solder balls are preformed for attachment to conductive pads or terminals on the substrate having a semiconductor device wire bonded thereto.

U.S. Pat. No. 5,468,995 illustrates the use of compliant polymer columnar I/O connections on the bottom of a substrate connected to the upper side of the substrate to accommodate thermally induced stress during semiconductor device operation.

Therefore, based on the foregoing, it would be advantageous to develop a BGA wherein the interconnect bumps substantially overcome the problems associated with the conventional solder balls used in flip-chip packaging.

SUMMARY OF THE INVENTION

The present invention relates to a method and apparatus for providing a BGA that electrically and mechanically interconnects a semiconductor device to a substrate for flip-chip packaging. The present invention is directed to a method and apparatus for providing a plurality of balls in a BGA, of which the plurality of balls are substantially uniform in height. The method and apparatus provide a plurality of balls in a BGA that substantially obtains proper electrical connection between a semiconductor device and substrate for flip-chip packaging. The method and apparatus of the present invention provide a plurality of balls in a BGA, wherein the bumps include a core material and a thin outer layer of a different material than that of the core material. In the present invention, the core material has greater rigidity than the material of the outer layer. Further, the core material has a higher melting temperature than the material of the outer layer.

In one embodiment of the present invention, the core material is a conductive material having a thin layer of another conductive material thereover as an outer layer. In a second embodiment of the present invention, the core material is a non-conductive polymeric material having a thin layer of conductive material thereover as an outer layer. Alternatively, the core material is a conductive polymeric material or a composite material. In a third embodiment of the present invention, the core material is a conductive material having a thin outer layer of solder material.

In each embodiment of the present invention, the use of a solid core having a thin layer of another metal or solder thereover allows the reflow soldering of the semiconductor device to the substrate without the use of additional solder or solder flux being applied to either the present invention or the solder located on the bond pads of the semiconductor device or located on the contact pads of the substrate.

The method and apparatus of the present invention utilizing balls with a core material and an outer layer may be used to connect any type of semiconductor device, bare or packaged, to any type of substrate by flip-chip methods. Further, the method and apparatus of the present invention utilizing balls with a core material and an outer layer may be used to stack multiple semiconductor devices to one another by also using the flip-chip techniques.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings, in which:

DETAILED DESCRIPTION OF THE INVENTION

Figure 1:
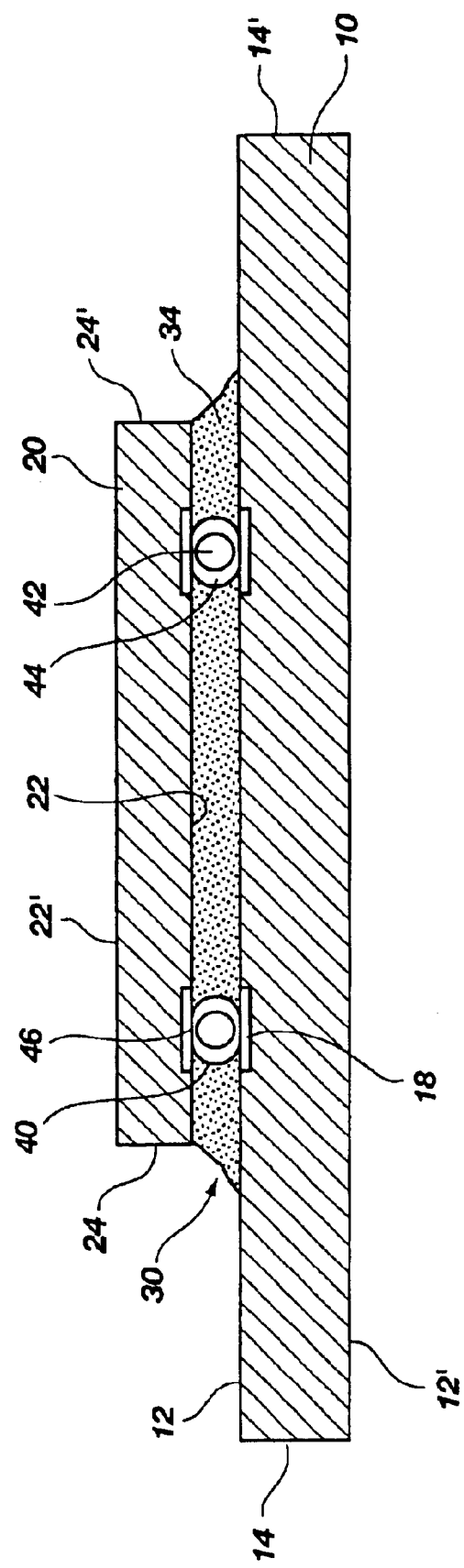
FIG. 1 is a cross-sectional view of a semiconductor die attached to a substrate with an underfill material and bumps therebetween in accordance with the present invention.
Figure 2:
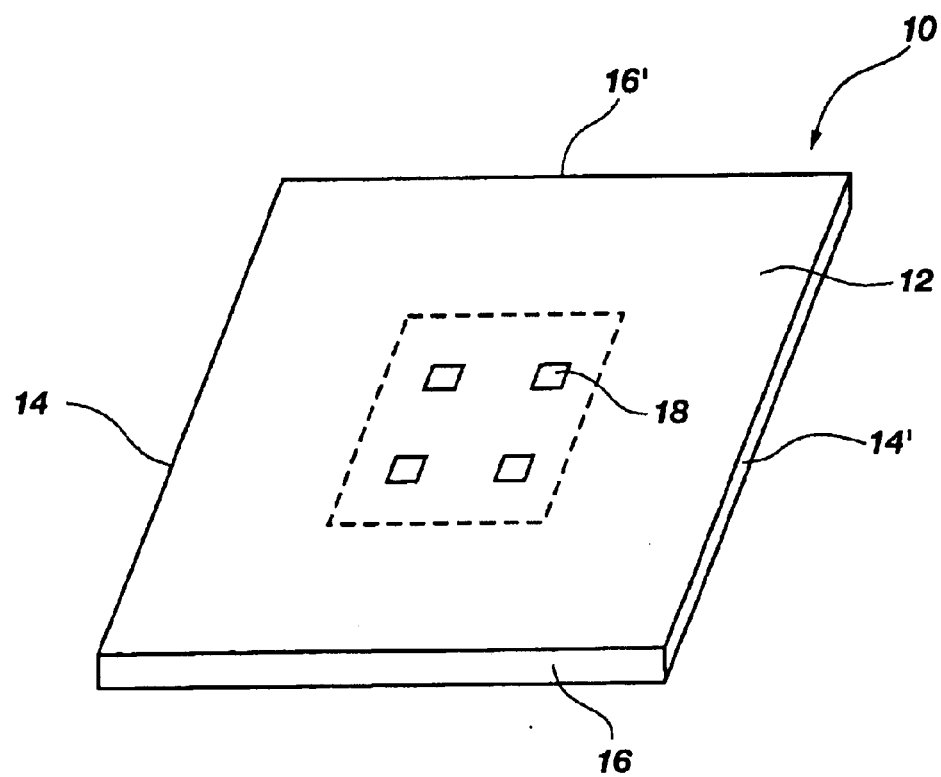
FIG. 2 is a diagrammatic perspective view of a semiconductor die with bumps and a substrate with bond pads in accordance with the present invention.

Referring to the drawings, illustrated in drawing FIG. 1 is a cross-sectional view of a suitable substrate or printed circuit board or chip carrier 10 connected to a semiconductor device, die or flip-chip 20 having a ball grid array 30 located therebetween. Substrate 10 typically comprises various materials, such as ceramic, silicone, glass, resin, and combinations thereof. Substrate 10 preferably comprises a printed circuit board (PCB) or other carrier, which is used in semiconductor die technology, such as an FR-4 PCB or BT resin PCB. Substrate 10 includes side walls 14, 14' and 16, 16', an upper surface 12 and a lower surface 12'. Side walls 14 and 14' oppose each other and side walls 16 and 16' oppose each other. The upper surface 12 has circuits and/or contact pads 18 located thereon. (See drawing FIG. 2.)

Figure 3:
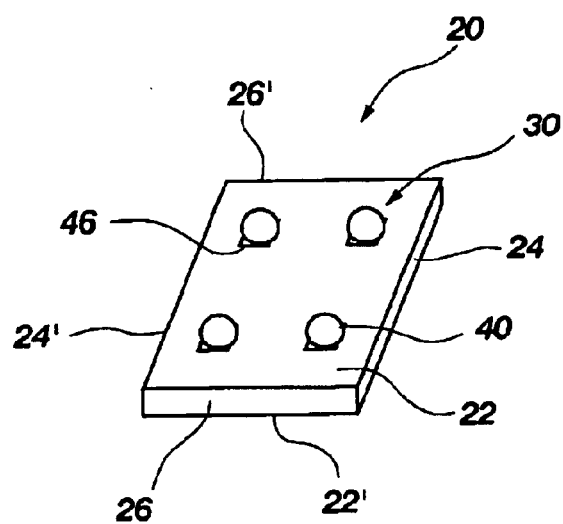
FIG. 3 is a perspective view of a semiconductor die with a plurality of bumps to illustrate a ball grid array in accordance with the present invention.
Figure 3A:
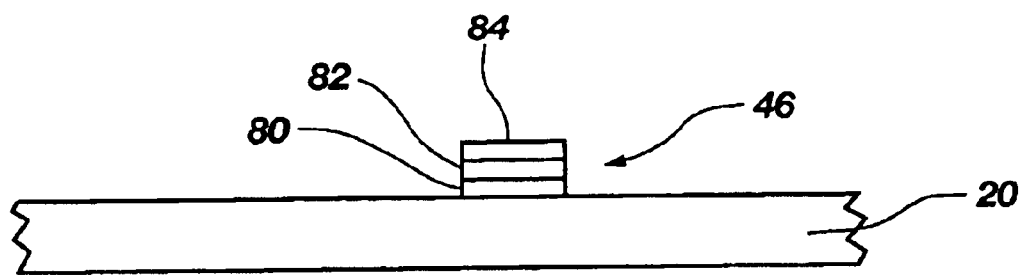
FIG. 3A is a view of a multi-layered bond pad on a semiconductor device.

Referring to drawing FIG. 3, semiconductor device 20 includes a plurality of sides 24, 24', 26, 26', an active surface 22 and a back surface 22' thereof. The sides 24 and 24' of the semiconductor device 20 oppose each other while sides 26 and 26' oppose each other. The active surface 22 includes integrated circuitry and a plurality of bond pads 46 having a plurality of balls 40 thereon for providing both electrical connection and mechanical connection to the substrate 10. As depicted in drawing FIG. 3, the plurality of balls 40 are illustrated as a ball grid array (BGA) 30, each of the plurality of balls 40 being mounted on the integrated circuitry and bond pads 46 on the active surface 22 of the semiconductor die 20. The bond pads 46 on the semiconductor die 20 and the contact pads 18 on the substrate 10 may be made of any conductive material, such as gold, copper, nickel, aluminum, lead/tin, and/or alloys thereof. Referring to drawing FIG. 3A, the bond pads 46 of the semiconductor device 20 may be formed of layers of any suitable conductive material, such as a layer of copper 80 and a layer of aluminum 82 covered by a layer of suitable solder 84. Similarly, the contact pads of a substrate or printed circuit board may comprise multiple layers of any suitable conductive material, such as a layer of copper, and a layer of aluminum covered by a layer of suitable solder, such as illustrated with respect to bond pad 46 of semiconductor device 20.

Referring back to drawing FIG. 1, an electrical assembly is produced by placing and securing the semiconductor die 20 on the upper surface 12 of substrate 10. Specifically, the balls 40 on the bond pads 46 of the semiconductor die 20 are aligned with the circuits and/or contact pads 18 located on upper surface 12 of substrate 10. The semiconductor die 20 is then electrically and mechanically connected to the substrate 10 by reflowing or curing the balls 40 to the circuits and/or contact pads 18 of upper surface 12 of substrate 10, depending upon the type of material comprising the balls 40. Alternatively, the balls 40 may be formed on the circuits and/or contact pads 18 of the upper surface 12 of the substrate 10 prior to attachment of the semiconductor die 20 thereto. In other words, either the bond pads 46 of the semiconductor die 20 or the circuits and/or contact pads 18 of the substrate 10, or both, may include the balls, such as balls 40, thereon.

Figure 4:
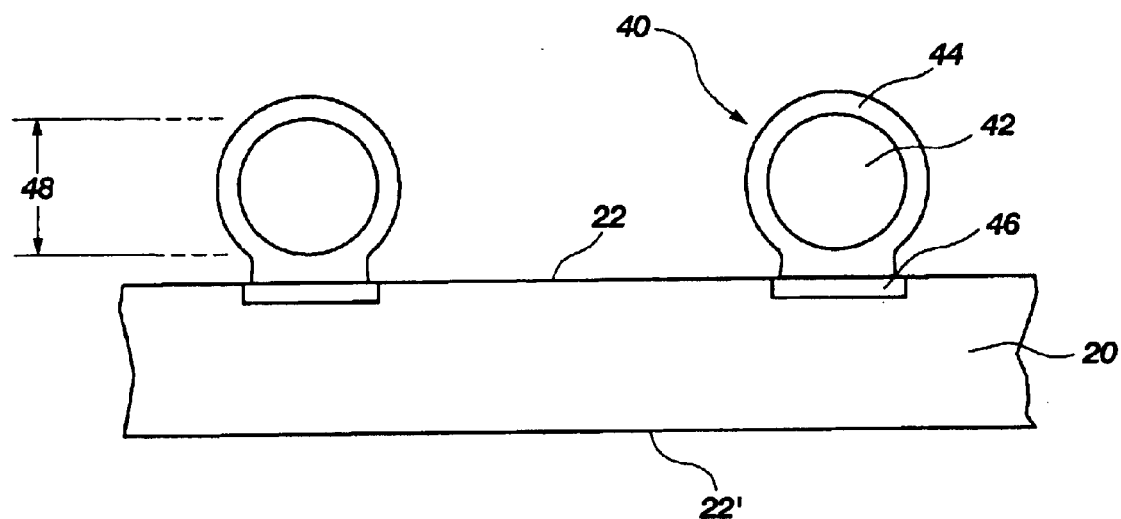
FIG. 4 is a cross-sectional view of a portion of a semiconductor die illustrating bumps formed on bond pads in accordance with the present invention.

In the present invention, the plurality of balls 40 in the BGA 30 are of a much smaller size than that of the conventional solder balls used in wire bonding and TAB packaging techniques. Specifically, the balls 40 in the present invention include a diameter of approximately fifty (50) microns to one hundred twenty-five (125) microns and are made for use in flip-chip packaging techniques. As shown in cross-section in drawing FIG. 4, the balls 40 include a core material 42 and an outer layer 44. The diameter of the core material 42 is approximately 80%–99% of the diameter of the balls 40. Alternately, the balls 40 may include an outer layer having a thickness in the range of 0.5 to 10 microns, preferably having a thickness of substantially one micron of silver or an alloy thereof.

According to the present invention, the melting-point temperature of the core material 42 is higher than that of the melting-point temperature of the outer layer 44. Furthermore, the core material is greater in rigidity than that of the outer layer to resist mechanical impact and thermal fatigue while maintaining good electrical conductivity. As such, the outer layer 44 of each of the bumps may be softer than that of the core material. Therefore, the balls 40 in the present invention compensate for any non-planarity on the active surface 22 of the die 20, the upper surface 12 of the substrate 10, and/or any differing height in the balls 40 of the BGA 30. A preferred core material is copper while the outer layer 44 is preferred to be silver or an alloy thereof. Alternately, the balls 40 may comprise silver or an alloy thereof, if cost of material is not a significant factor of manufacturing cost.

For example, during burn-in testing, test sockets for receiving the BGA 30 may procure marks in the softer outer layer 44 of the balls 40. This may result in different ball heights when later surface mounting the die 20 on the substrate 10. However, since the core material 42 has a greater rigidity and higher melting-point temperature, the core material 42 provides a substantially consistent base height 48. Further, the substantially consistent base height 48 is maintained before and after reflow during burn-in testing and, importantly, the final mounting process of the die 20 on the substrate 10. Therefore, any marks produced during burn-in testing do not result in a co-planarity problem as the marks are only procured to the depth of the core material 42. This problem is further minimized when considering that the preferred ball 40 comprises a copper core 42 having a thin layer of silver or an alloy outer layer 44 thereover having a thickness of approximately or substantially one (1) micron when the core has a diameter in the range of approximately seventy-five (75) microns to one hundred twenty-five (125) microns. In this manner, the thin layer of silver or an alloy thereover, even if damaged, cannot cause a great variation in the height of an individual ball 40.

Thus, it can be well appreciated that an important function of the core material 42 is its substantially consistent base height 48 before and after the reflow process. Further, the substantially consistent base height 48 of the core material also provides for a more consistent outer diameter for each of the balls 40 in the BGA 30 after the outer layer is added thereon. Therefore, the BGA 30 of the present invention provides compensation for any non-planar anomalies in the surfaces of the substrate 10, die 20, and/or a testing substrate. Furthermore, the rigid core material 42 in the bumps 40 offers greater fatigue resistance compared to the conventional solder balls. Therefore, based on the foregoing, the BGA 30 of the present invention will provide a more efficient and cost-effective product than that provided conventionally. Additionally, depending upon the choice of the core material 42 and the outer layer 44, the semiconductor device 20 may be bonded by a solder reflow process using only a layer of solder applied to the bond pad of a semiconductor device and a layer of solder applied to the contact pad of a substrate or printed circuit board without the use of either additional solder or solder flux thereby eliminating process steps and the potential for problems due to excess solder.

Figure 3B:
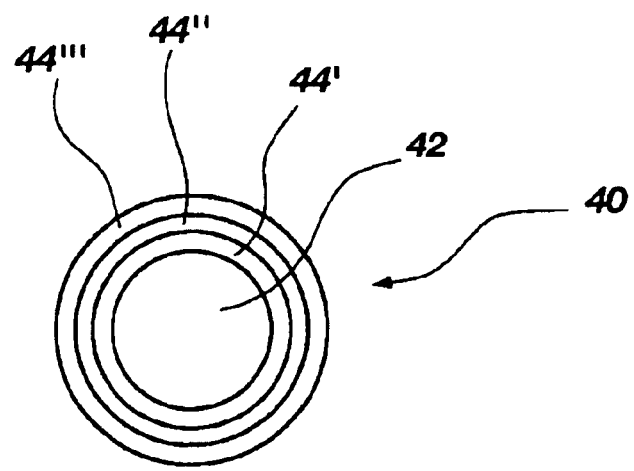
FIG. 3B is a view of an embodiment of the present invention having multi-layers of conductive materials thereon.

In a first embodiment, the core material 42 is a conductive material and the outer layer is a conductive layer other than that of solder material. The core material 42 may be any known conductive material or alloy, such as copper, nickel, palladium, gold, titanium, silver or alloy thereof, but is preferably, copper or a copper alloy. The outer layer 44 may be any known conductive material, such as silver, nickel, palladium, gold, titanium, copper or alloy thereof, as long as the rigidity and the melting temperature of the material of the outer layer 44 is less than that of the core material 42 and as long as the conductive material causes solder to adhere thereto without the use of solder flux or an additional amount of solder. The preferred material for the outer layer 44 is silver or a silver alloy. Furthermore, additional layers, such as an adhesion-promoting layer, may be added to the core material 42 to enhance the adhesion of the silver or silver alloy of the outer layer 44 thereon. For instance, referring to drawing FIG. 3B, a ball 40 is illustrated including a core 42, such as a copper core, a first outer layer 44', such as nickel and/or an alloy thereof, a second outer layer 44", such as aluminum and/or an alloy thereof, and a third outer layer 44'", such as silver and/or an alloy thereof. It should be noted that the thickness of each layer forming the outer layer 44 is preferably approximately one (1) micron when the diameter of the core 42 is approximately in the range of one hundred (100) microns to one hundred twenty-five (125) microns. In this manner, any damage to any or all the outer layers forming the outer layer 44 cannot substantially affect the overall diameter of the ball 40. Further, it should be noted that process techniques for applying a thin layer having a thickness of approximately one (1) micron must be used for the ball 40 as conventional plating process techniques and dipping process techniques, particularly, solder plating process techniques and dipping process techniques, result in an outer layer 44 having too great a thickness in comparison to the diameter of the core 42. That is, solder plating process techniques and solder dipping techniques to form the outer layer 44 over the core 42 of a ball 40 are not satisfactory.

By utilizing the BGA 30 of the present invention, the conductive core and outer layer (i.e., copper core and silver outer layer) has a much lower electrical resistance. As a result, the computing speed of the present invention is greater than the interconnecting conventional solder balls. In addition, since solder is not used as the outer layer in the first embodiment, there is no need to include the step of adding an acid flux or milder rosin flux to the solder material in order to prevent oxidation of a solder material. Further, the first embodiment of the ball 40 comprising a solid core 42 and thin outer layer 44, i.e., copper core and silver outer layer, provides a core material that can withstand aggressive contacting of the balls when the semiconductor die is tested in different sockets. As such, the rigidity of the core material 42 prevents non-uniformity or compensates for non-planarity in the die 20, substrate 10 and/or differing base heights of the balls 40 in the BGA 30, as set forth previously.

In another embodiment of the present invention, the ball 40 comprises a core material 42 of a conductive material and an outer layer 44 of any known solder material or solder paste used in the art. The core material 42 may be any known conductive material or alloy, such as nickel, palladium, copper, gold, silver, or titanium, or combination thereof, but is preferably copper, nickel and/or palladium, or a nickel or palladium alloy. The preferred solder used as the outer layer is approximately 95% Pd and 5% Sn, but is not limited to this Pd/Sn range. Furthermore, additional layers, such as an adhesion-promoting layer, may be added to the core material 42 to enhance the adhesion of the solder material thereon.

In a third embodiment of the present invention, the ball 40 comprises a core material 42 that is a non-conductive polymeric material. Outer layer 44 may be any known solder material or solder paste used in the art. The core material 42 may be any known polymeric material or resin as long as the polymeric material has a glass-transition temperature greater than that of the melting temperature of the solder material of the outer layer 44. Additionally, it is preferred that the polymeric material is a low moisture absorption polymer, such as a polyimide. Other acceptable polymeric materials are polybenzoxazole (PBO) or polystyrene. The polymeric core provides increased resilience to the bumps of the BGA 30. Further, the polymeric core reduces the mismatch in the coefficient of thermal expansion between the semiconductor die 20 and the substrate 10. The outer layer 44 may be any known conductive material, such as silver, nickel, palladium, gold, titanium, copper or alloy thereof, as long as the rigidity of the outer layer is less than that of the core material 42. The preferred material for the outer layer 44 is silver or a silver alloy. Alternately, as in the previous embodiment, a preferred solder used as the outer layer 44 is approximately 95% Pd and 5% Sn. Furthermore, additional layers, such as an adhesion-promoting layer, may be added to the core material to enhance the adhesion of the solder material thereon.

As an alternative to the third embodiment of the present invention, the core material 42 may be a conductive polymeric material, a composite material, and/or an epoxy material, provided that the conductive polymeric material, the composite material, and/or the epoxy material has a glass-transition temperature greater than that of the melting temperature of the solder material on the outer layer 44.

In a fourth embodiment of the invention, the bump 40 comprises core material 42 that is a non-conductive polymeric material and the outer layer 44 is of a highly conductive material, such as a metal. The core material 42 may be any known polymeric material or resin as long as the polymeric material has a glass-transition temperature greater than that of the melting temperature of the solder material of the outer layer 44. Additionally, it is preferred that the polymeric material is a low moisture absorption polymer, such as a polyimide. Other acceptable polymeric materials are polybenzoxazole (PBO) or polystyrene. The polymeric core provides increased resilience to the balls of the BGA 30. Further, the polymeric core reduces the mismatch in the coefficient of thermal expansion between the semiconductor die 20 and the substrate 10. Furthermore, additional layers, such as an adhesion-promoting layer, may be added to the core material to enhance the adhesion of the silver and/or silver alloy material thereon. The outer layer 44 may be any known conductive material, such as silver, nickel, palladium, gold, titanium, copper or alloy thereof, as long as the rigidity is less than that of the core material 42. The preferred material for the outer layer 44 is silver or a silver alloy. Furthermore, additional layers, such as an adhesion-promoting layer may be added to the core material 42 to enhance the adhesion of the silver or silver alloy of the outer layer 44 thereon.

As an alternative to the fourth embodiment of the present invention, the bump 40 comprises a core material 42 of a conductive polymeric material, a composite material, and/or an epoxy material, provided that the conductive polymeric material, the composite material, and/or the epoxy material has a metallic outer layer 44 thereover. The outer layer 44 may be any known conductive material, such as silver, nickel, palladium, gold, titanium, copper or alloy thereof, as long as the rigidity is less than that of the core material 42. The preferred material for the outer layer 44 is silver or a silver alloy. Furthermore, additional layers, such as an adhesion-promoting layer, may be added to the core material 42 to enhance the adhesion of the silver or silver alloy of the outer layer 44 thereon.

By utilizing the BGA 30 of the present invention, the conductive core and outer layer (i.e., copper core and silver outer layer) have a much lower electrical resistance. As a result, the computing speed of the present invention is greater than the interconnecting conventional solder balls. In addition, since solder is not used as the outer layer in the third embodiment, there is no need to include the step of adding an acid flux or milder rosin flux to the solder material in order to prevent oxidation of the solder material. Further, as in the previous two embodiments, the solid core and thin outer layer of the third embodiment, i.e., copper core and silver outer layer, provides a core material that can withstand aggressive contacting of the bumps when the semiconductor die is tested in different sockets. As such, the rigidity of the core material 42 prevents non-uniformity or compensates for non-planarity in the die 20, substrate 10 and/or differing base heights of the balls 40 in the BGA 30, as set forth previously.

When the balls 40 on the bond pads 46 of the semiconductor die 20 are reflowed to electrically and mechanically connect the semiconductor die 20 to the circuits and/or contact pads 18 of the substrate 10, a space or gap is formed between the active surface 22 of semiconductor die 20 and the upper surface 12 of substrate 10, the size of the gap generally being determined by the size of the reflowed solder on the bond pads of the semiconductor device, the reflowed solder on the contact pads on the substrate or printed circuit board and the balls on the bond pads of the semiconductor device 20.

Once the semiconductor die 20 is mounted on the substrate 10, an underfill material 34 is applied to fill the gap between the semiconductor die 20 and the substrate 10 (see FIG. 1). Filling the gap with the underfill material 34 is typically accomplished by a method utilizing capillary action, although it is understood that any method known in the art may be used to fill the gap. The purpose of the underfill material 34 is to provide a reduced corrosion environment between the substrate 10 and semiconductor device 20, help provide an additional mechanical bond between the semiconductor device 20 and the substrate 10, to help distribute loading and stress on the semiconductor device 20 and balls 40, and to help transfer heat from the semiconductor device 20. The underfill material 34 typically comprises a polymeric material, such as an epoxy or an acrylic resin, and may contain inert filler material therein. The underfill material 34 typically has a thermal coefficient of expansion that approximates that of the semiconductor device 20 and/or the substrate 10 to help minimize loading and stress placed on either the semiconductor device 20 or the substrate 10 during the operation of the semiconductor device 20 caused by the heating of the underfill material 34.

It should be understood that although the present invention has been described as a ball or plurality of balls indicating a generally spherical shape, other geometric shapes may be used, such as elliptical, etc., so long as the core thereof has a thin outer layer of material thereover in relation to the thickness of the core, such as described herein.

Hereinbefore, various embodiments of methods and apparatus for bonding a plurality of bumps between a semiconductor die and a substrate have been described. However, the various embodiments are merely exemplary of the present invention, and thus, the specific features described herein are merely used to more easily describe such embodiments and to provide an overall understanding of the present invention. Accordingly, one skilled in the art will readily recognize that the present invention is not limited to the specific embodiments described herein.

As such, while the present invention has been described in terms of certain methods and embodiments, it is not so limited, and those of ordinary skill in the art will readily recognize and appreciate that many additions, deletions and modifications to the embodiments described herein may be made without departing from the scope of the invention as hereinafter claimed. For instance, the use of bumps with a core material and an outer layer may be used to connect any type of semiconductor device, bare or packaged, to any type of substrate; and further, the use of bumps with a core material and an outer layer may be used to stack multiple semiconductor devices to one another.

What is claimed is:

1. A method for connecting a semiconductor device having an active surface having at least one bond pad thereon, said at least one bond pad having a layer of solder on at least a portion thereof, to a substrate having a surface having at least one contact thereon, said at least one contact having a layer of solder on at least a portion thereof, said method comprising:

providing at least one ball between said at least one bond pad on said active surface of said semiconductor device and said at least one contact on said surface of said substrate, said at least one ball including a core and an outer layer being solder wettable by at least a portion of said layer of solder on said at least a portion of said at least one bond pad on said active surface of said semiconductor device and said layer of solder on said at least a portion of said at least one contact on said surface of said substrate, said at least one ball having a diameter of at least approximately 50 $\mu$ms, said at least one ball including a rigid non-conductive polymer, said core having a diameter in the range of 80% to 99% of said diameter of said at least one ball, said outer layer comprising one of silver and a silver alloy having a thickness of about 1 $\mu$m substantially covering an entire surface of said core;

reflowing said layer of solder on said at least a portion of said at least one bond pad on said active surface of said semiconductor device and said layer of solder on said at least a portion of said at least one contact on said surface of said substrate for connecting said semiconductor device to said substrate; and curing said at least one ball so that a portion of said outer layer of said at least one ball bonds to one of said at least one bond pad on said active surface of said semiconductor device, said at least one contact on said surface of said substrate, and both said at least one bond pad of said semiconductor device and said at least one contact of said substrate.

2. The method according to claim 1, wherein said outer layer comprises a material having a rigidity less than a material of said core.

3. The method according to claim 1, wherein said core includes a base height.

4. The method according to claim 1, wherein said outer layer comprises at least one conductive layer.

5. A method for making a flip-chip assembly, said method comprising:

providing a semiconductor device having an active surface having a plurality of bond pads thereon, at least a portion of each bond pad of said plurality of bond pads having a layer of solder thereon, and a substrate having a surface having a plurality of contacts thereon, at least a portion of each contact of said plurality of contacts having a layer of solder thereon;

providing a plurality of balls to contact at least one bond pad of said plurality of bond pads on said active surface of said semiconductor device and to contact at least one contact of said plurality of contacts on said surface of said substrate, at least one ball of said plurality of balls including a core material and an outer layer, said at least one ball of said plurality of balls having a diameter of at least approximately 50 $\mu$ms, said at least one ball of said plurality of balls comprised of a rigid non-conductive polymer, said core material having a diameter in the range of 80% to 99% of said diameter of said at least one ball of said plurality of balls, said outer layer comprising one of silver and a silver alloy having a thickness of about 1 $\mu$m substantially covering an entire surface of said core material; and bonding said at least one ball of said plurality of balls to said at least one bond pad of said plurality of bond pads on said active surface of said semiconductor device and to said at least one contact of said plurality of contacts on said surface of said substrate, said bonding including reflowing said layer of solder on said at least a portion of each of said plurality of bond pads on said active surface of said semiconductor device and reflowing said layer of solder on said at least a portion of each of said plurality of contacts on said surface of said substrate.

6. The method according to claim 5, wherein said reflowing further comprises curing said plurality of balls so that said outer layer of said at least one ball of said plurality of balls bonds to said plurality of contacts on said surface of said substrate.

7. The method according to claim 5, wherein said core material includes a height, said height of said core material of said at least one ball of said plurality of balls being substantially equal to said height of said core material of other balls of said plurality of balls.

8. The method according to claim 5, wherein said outer layer comprises at least one conductive layer.

9. The method according to claim 5, wherein said core material comprises a polymeric material.

10. A method for preparing a flip-chip assembly, said method comprising:

providing a semiconductor device having an active surface having a plurality of bond pads thereon, a plurality of said plurality of bond pads having a layer of solder on at least a portion thereof; and providing a plurality of balls on said plurality of bond pads on said active surface of said semiconductor device, at least one ball of said plurality of balls including a core material and an outer layer of solder wettable material having a rigidity less than said core material, said at least one ball of said plurality of balls having a diameter of at least approximately 50 $\mu$ms, said at least one ball of said plurality of balls including a rigid non-conductive polymer, said core material having a diameter in the range of 80% to 99% of said diameter of said at least one ball of said plurality of balls, said outer layer comprising one of silver and a silver alloy having a thickness of about 1 $\mu$m substantially covering an entire surface of said core material, said core material including a height, said height of said core material of said at least one ball of said plurality of balls being substantially equal to said height of said core material of other balls of said plurality of balls.

11. The method according to claim 10, wherein said outer layer comprises at least one conductive layer.

12. A method for preparing a plurality of balls for a flip-chip assembly, said method comprising:

providing at least one ball of said plurality of balls having a diameter of at least approximately 50 $\mu$ms;

providing a core material for said at least one ball of said plurality of balls, said core material having a diameter in the range of 80 to 99% of said diameter of said at least one ball of said plurality of balls; and providing an outer layer on said core material for said at least one ball of said plurality of balls, said outer layer comprising a material having a rigidity less than said core material, said outer layer including a solder wettable material having a thickness of 10% to less than 1% of said diameter of said core material, said outer layer comprised of one of silver and a silver alloy covering substantially an entire surface of said core material having a thickness of about 1 $\mu$m, said core material including a height, said height of said core material of said at least one ball of said plurality of balls being substantially equal to said height of said core material of other balls of said plurality of balls.

13. The method according to claim 12, wherein said outer layer comprises at least one conductive layer.

* * * * *